United States Patent [19]
Matsuoka et al.

[11] Patent Number: 5,926,741
[45] Date of Patent: Jul. 20, 1999

[54] METHOD OF FORMING GATE DIELECTRIC FILMS FOR MOSFETS WITHOUT GENERATION OF NATURAL OXIDE FILMS

[75] Inventors: Toshimasa Matsuoka, Yao; Masayuki Nakano, Tenri; Hiroshi Iwata, Ikoma-gun; Seizo Kakimoto, Shiki-gun, all of Japan

[73] Assignee: Sharp Kabushiki Kaisha, Osaka, Japan

[21] Appl. No.: 08/888,470

[22] Filed: Jul. 7, 1997

[30] Foreign Application Priority Data

Jul. 12, 1996 [JP] Japan ................................... 8-183738

[51] Int. Cl.$^6$ ................................................. H01L 21/31
[52] U.S. Cl. ........................... 438/778; 438/769; 438/770
[58] Field of Search .................... 438/762, 702, 438/771, 769, 974, 777, 775, 770, 778

[56] References Cited

U.S. PATENT DOCUMENTS

| | | | |
|---|---|---|---|
| 5,198,392 | 3/1993 | Fukuda et al. | 438/769 |
| 5,455,204 | 10/1995 | Dobuzinsky et al. | 437/238 |
| 5,461,254 | 10/1995 | Tsai et al. | 257/646 |

OTHER PUBLICATIONS

E. Hasegawa, et al., *The impact of nitrogen profile engineering on ultra–thin nitrided oxide films for dual–gate CMOS–ULSI,* International Electron Devices Meeting Technical Digest, 1995, pp. 327–330.

J. Kim, et al., *Effects of Residual Surface Nitrogen on the Dielectric Breakdown Characteristics of Regrown Oxides,* vol. 14, No. 5, 1993, pp. 265–267.

*Primary Examiner*—Tuan H. Nguyen
*Assistant Examiner*—Reneé R. Berry
*Attorney, Agent, or Firm*—David G. Conlin; William J. Daley, Jr.

[57] ABSTRACT

In a method of forming gate dielectric films, a surface of a Si wafer is first cleaned in an inert gas ambient into a clean state having no naturally oxidized films. Then, after replacing the inert gas ambient with an oxidizing gas containing no nitrogen without exposing the wafer to air, the wafer is heated in the replaced ambient to form a first silicon oxide film on the silicon surface. Then, the ambient is again replaced with an oxidizing gas containing nitrogen, and the wafer is heated in the replaced ambient to form a first oxynitride film between the first silicon oxide film and the silicon. Thereafter, re-oxidation of the wafer is performed in an ambient of oxidizing gas containing no nitrogen to form a second silicon oxide film between the first oxynitride film and the silicon.

27 Claims, 10 Drawing Sheets

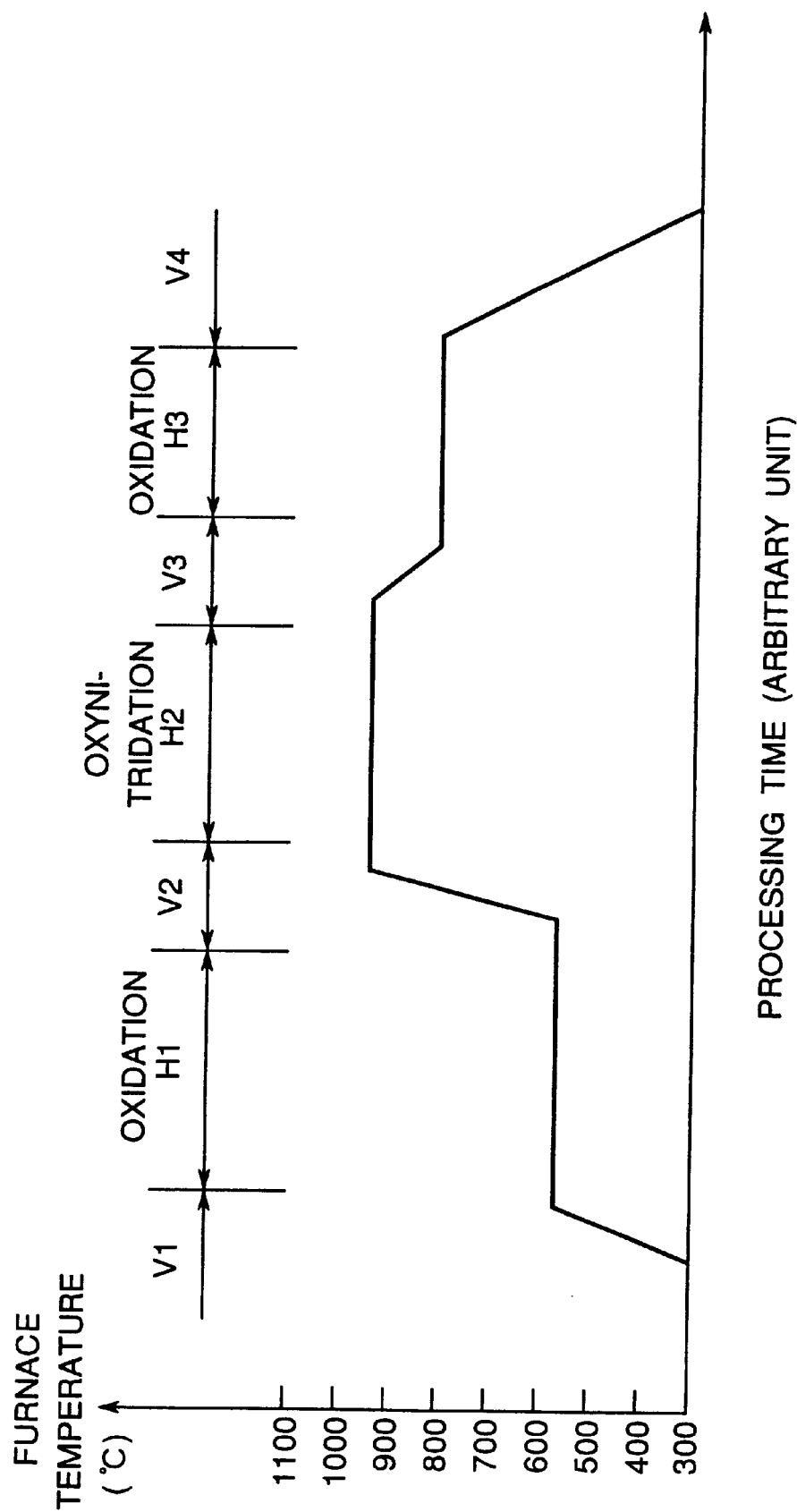

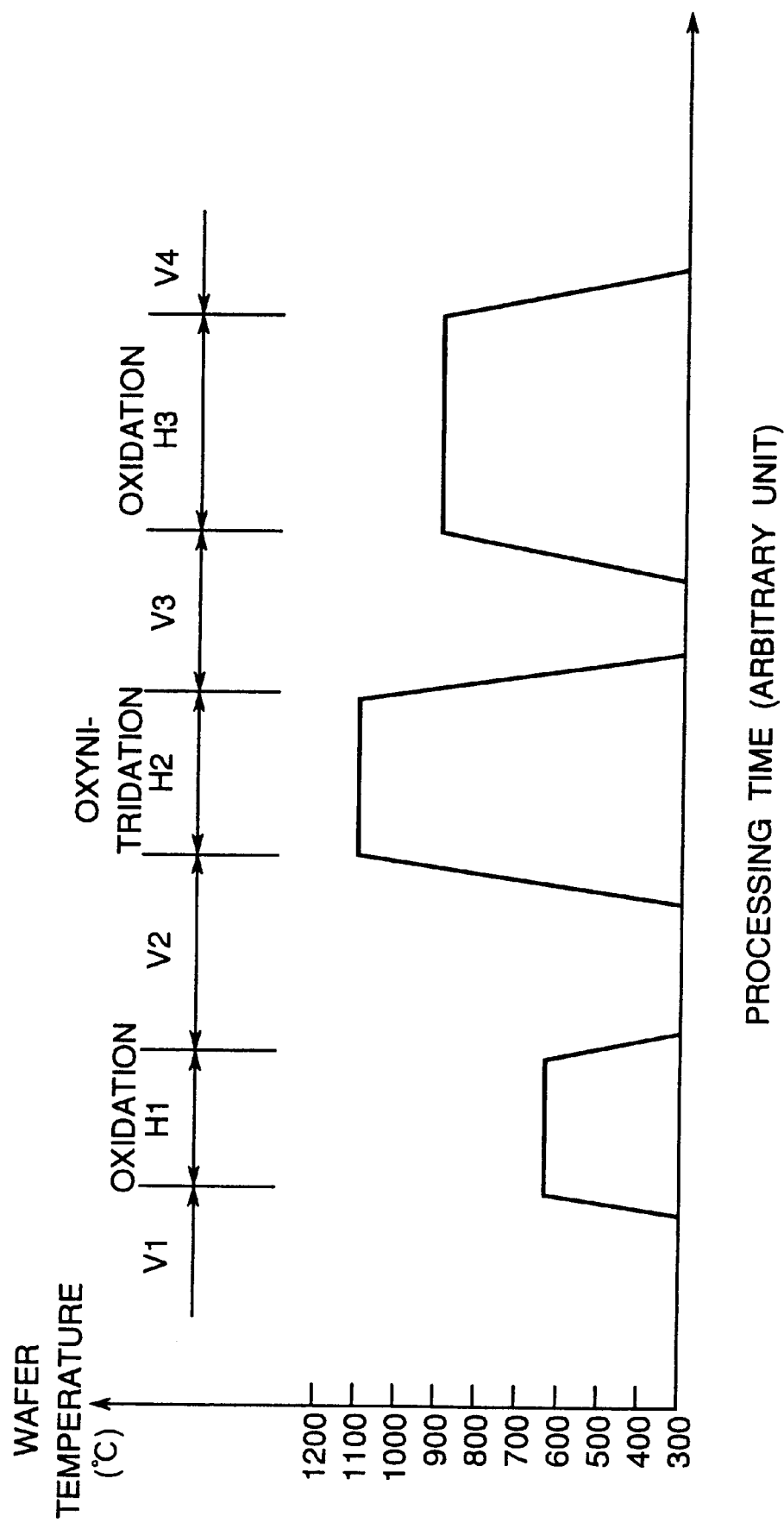

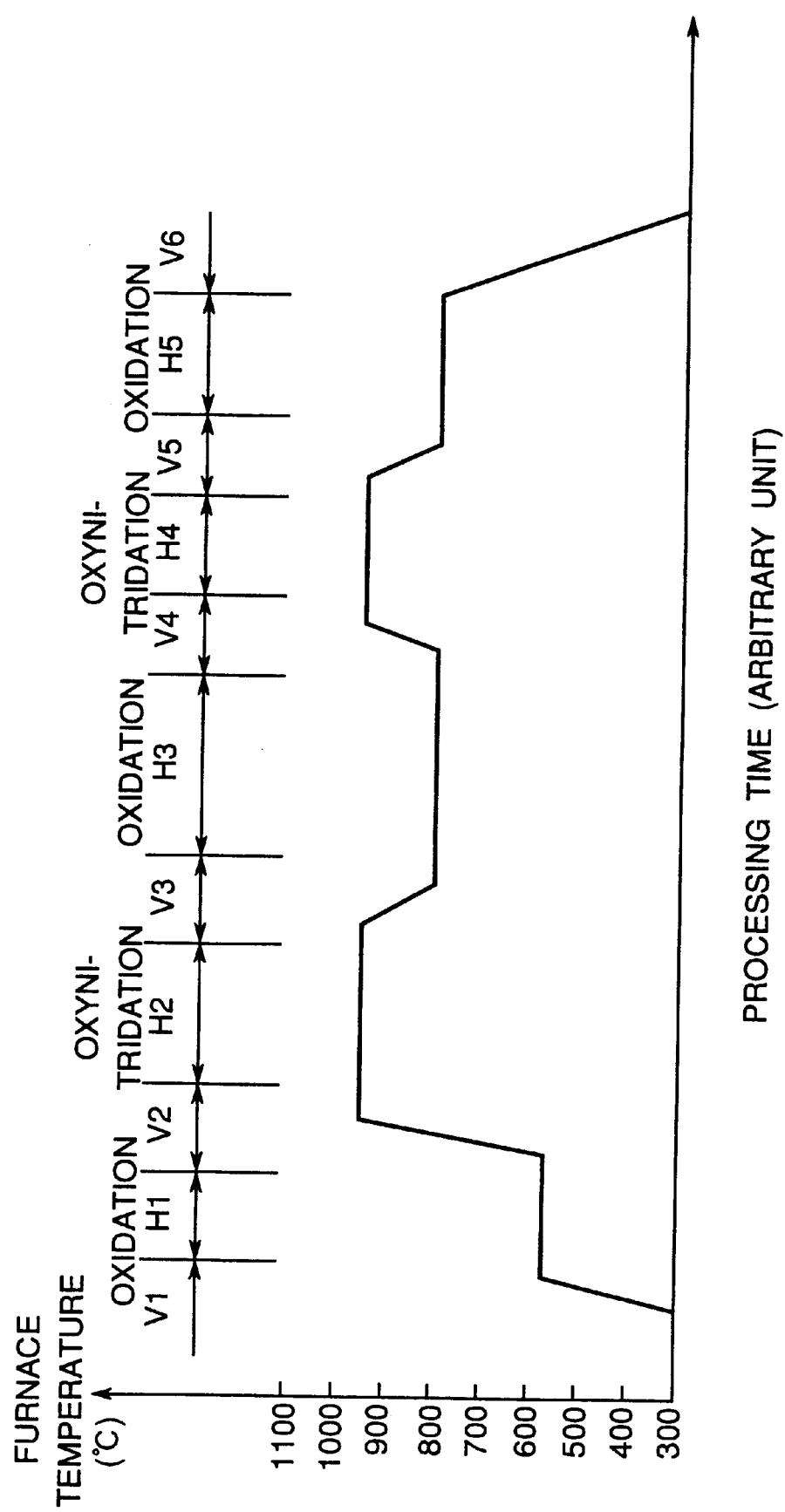

METHOD OF FORMING GATE DIELECTRIC FILMS FOR MOSFETS WITHOUT GENERATION OF NATURAL OXIDE FILMS

BACKGROUND OF THE INVENTION

The present invention relates to a gate dielectric film forming method. More specifically, the invention relates to a gate dielectric film forming method of forming gate dielectric films for semiconductor electron devices, particularly for metal insulator semiconductor field effect transistors typified by MOSFETs (Metal Oxide Semiconductor Field Effect Transistors).

As a method of fabricating gate dielectric films for MOSFETs of VLSIs or the like, there has been a method which comprises steps of: performing a first oxidation of a silicon (Si) substrate in an oxidizing gas ambient containing no nitrogen to form a first silicon oxide film ($SiO_2$) on a surface of the silicon substrate; thereafter, performing oxynitridation of the silicon substrate in a nitrogen-oxygen compound gas ambient ($NO$, $N_2O$, $NO_2$, etc.) to form an oxide film containing nitrogen (hereinafter, referred to as "oxynitride film") between the first silicon oxide film and the silicon substrate; and further performing another oxidation (re-oxidation) in an oxidizing gas ambient containing no nitrogen to form a second silicon oxide film between the oxynitride film and the silicon substrate (E. Hasegawa et al., International Electron Devices Meeting Technical Digest, pp. 327–330, 1995). Forming the second silicon oxide film between the oxynitride film and the silicon substrate causes rearrangement of atoms to occur. As a result, it becomes possible to solve various problems caused by oxynitridation, such as a strain in the $Si/SiO_2$ interface, an increase in hole traps due to chemical species related to nitrogen such as $Si_2$=NH, or a decrease in the carrier mobility in regions having low electric fields in directions vertical to the MOS interface.

However, when merely the above method is executed, the film thickness uniformity or the interface flatness of the gate dielectric film is deteriorated by re-oxidation, resulting disadvantageously in degraded dielectric breakdown properties of the gate dielectric film (e.g., J. Kim et al., IEEE Electron device Letter, vol. 14, No. 5, pp. 265–267, 1993).

This mechanism can be considered as follows. Here, FIGS. 10A–10D are used to explain the mechanism.

In order to perform the first oxidation, a silicon substrate (indicated by 201 in FIG. 10A) is washed into a clean state free of naturally oxidized films. However, before the silicon substrate 201 is placed in an oxidizing furnace, particularly on its way to be introduced into an oxidation reaction tube, the silicon substrate 201 is subjected to exposure to the air at high temperature. As a result, a non-uniform, naturally oxidized film 202A may be formed on the surface of the silicon substrate 201, as shown in FIG. 10A, so that roughnesses may be generated at an $Si/SiO_2$ interface 201a. In this state, the first oxidation is performed so that a silicon oxide film 202 of a specified film thickness is formed as shown in FIG. 10B, with the result of increased roughnesses of the $Si/SiO_2$ interface 201a. Next, when the oxynitridation is performed, indeed the interface 201a between an oxynitride film 203 and the silicon substrate 201 may become smoother than before the oxynitridation process is performed, as shown in FIG. 10C, but there will arise non-uniformities in the film thickness or nitrogen concentration of the oxynitride film 203 due to scattering of film thickness of the original silicon oxide film 202. Subsequently, when the re-oxidation is performed to form a silicon oxide film 204 between the oxynitride film 203 and the silicon substrate 201, as shown in FIG. 10D, the diffusion of oxygen molecules from the ambient into the silicon substrate 201 may be blocked by the presence of nitrogen atoms in the oxynitride film 203. As a result, the degree of scattering of film thickness of the silicon oxide film 204 may become larger and the roughness of the interface 201a between the silicon oxide film 204 and the silicon substrate 201 may also increase. This will cause a wide scattering of film thickness of the gate dielectric films 202, 203 and 204 as a whole, and which in turn cause a decrease in the dielectric breakdown withstand voltage of the gate dielectric films.

Thinning the film thickness of the silicon oxide film 204 formed by re-oxidation and/or shortening the re-oxidation time prevents any lowering of the dielectric breakdown withstand voltage, but various problems related to the oxynitridation will remain unsolved.

SUMMARY OF THE INVENTION

Therefore, an object of the present invention is to provide an improvement on the gate dielectric film forming method which performs a re-oxidation process after an oxynitridation process, which improvement can solve various problems accompanying the oxynitridation process, reduce scattering of film thickness of each gate dielectric film and prevent any lowering of the dielectric breakdown withstand voltage of the gate dielectric films.

In order to accomplish the above object, the present invention provides a method of forming gate dielectric films, said gate dielectric films at least including two silicon oxide films and an oxynitride film disposed between the two silicon oxide films, including:

(a) cleaning a surface of a wafer in an ambient composed of an inert gas, into a clean state having no naturally oxidized films, at least the surface of the wafer being formed of silicon surface;

(b) replacing the ambient with an oxidizing gas containing no nitrogen without exposing the wafer to air, and then heating the wafer in the replaced ambient to form a first silicon oxide film on the silicon surface;

(c) replacing the ambient with an oxidizing gas containing nitrogen, and heating the wafer in the replaced ambient to form a first oxynitride film between the first silicon oxide film and the silicon; and (d) replacing the ambient with an oxidizing gas containing no nitrogen, and then heating the wafer in the replaced ambient to form a second silicon oxide film between the first oxynitride film and the silicon.

With this gate dielectric film forming method, in an ambient consisting of an inert gas, the silicon surface of a wafer is cleaned into a clean state free from any natural oxide film (step (a)), and thereafter the ambient is replaced with an oxidizing gas containing no nitrogen without exposing the wafer to the air. Accordingly, natural oxide films will not be formed on the silicon surface. When the first silicon oxide film is formed by heating the wafer in the ambient composed of the oxidizing gas without nitrogen (process (b)), an interface between the first silicon oxide film and the silicon (substrate silicon) becomes flat, so that the first silicon oxide film becomes substantially uniform in film thickness.

Next, the ambient is replaced with an oxidizing gas containing nitrogen, and the wafer is heated in this ambient, whereby the first oxynitride film is formed between the silicon oxide film and the substrate silicon (process (c)).

Since the already formed first silicon oxide film is substantially uniform in film thickness, the oxynitride film also becomes substantially uniform in film thickness and nitrogen concentration. Accordingly, when the second silicon oxide film is formed by replacing the ambient with an oxidizing gas containing no nitrogen, and by heating the wafer in this ambient (process (d)), the second silicon oxide film also becomes substantially uniform in film thickness, and an interface between the second silicon oxide film and the substrate silicon is also flattened.

Thus, scattering, or variation, of film thickness of the gate dielectric films as a whole is reduced, compared with the prior art, so that the dielectric breakdown withstand voltage is improved. Further, this method enables fabrication of the second silicon oxide film having a film thickness enough to allow a solution of various problems accompanying the oxynitriding process, such as changes in strain of the $Si/SiO_2$ interface, increases in hole traps due to chemical species related to nitrogen such as $Si_2$=NH, or decreases in the carrier mobility in regions having low electric fields in directions vertical to the MOS interface.

It is desirable to use Argon (Ar), nitrogen ($N_2$) or the like in which water and oxygen contents have been minimized, or reduced to as small quantities as possible.

The gate dielectric film forming method may further includes:

after forming said second silicon oxide film, replacing the ambient with an oxidizing gas containing nitrogen, and heating the wafer in this ambient to form a second oxynitride film between the second silicon oxide film and the silicon; and replacing the ambient with an oxidizing gas containing no nitrogen, and heating the wafer in this ambient to form a third silicon oxide film between the second oxynitride film and the silicon.

When forming, on the gate dielectric films formed by this method, a gate electrode of $P^+$ polycrystalline silicon having boron ions injected as impurities to fabricate a surface channel PMOSFET, the phenomenon called "boron penetration" (boron in the gate electrode penetrates the gate dielectric films into the silicon substrate and varies a flat band voltage) is prevented from occurring by the presence of the first oxynitride film which is located farther from the substrate silicon than the second oxynitride film. The first oxynitride film also cuts off diffusion of hydrogen from inter-layer dielectric films on the gate electrode, so that generation of an interface trap at the third silicon oxide film/silicon substrate interface is suppressed. As a result, device degradations due to hot carriers are prevented from increasing.

The present invention also provides a method of forming gate dielectric films, said gate dielectric films at least including two silicon oxide films and an oxynitride film disposed between the two silicon oxide films, including:

cleaning a surface of a wafer in an ambient composed of an inert gas, into a clean state having no naturally oxidized films, at least the surface of the wafer being formed of silicon;

replacing the ambient with an oxidizing gas containing no nitrogen without exposing the wafer to air, and then heating the wafer in the replaced ambient to form a first silicon oxide film on the silicon surface;

replacing the ambient with a gas composed of ammonia, and heating the wafer in the replaced ambient to form a silicon nitride film between the first silicon oxide film and the silicon;

replacing the ambient with an oxidizing gas containing no nitrogen, and heating the wafer in the replaced ambient to form a second silicon oxide film between the silicon nitride film and the silicon;

replacing the ambient with an oxidizing gas containing nitrogen, and heating the wafer in the replaced ambient to form an oxynitride film between the second silicon oxide film and the silicon; and replacing the ambient with an oxidizing gas containing no nitrogen, and heating the wafer in the replaced ambient to form a third silicon oxide film between the oxynitride film and the silicon.

This method is different from the above method having steps of forming two oxynitride films only in that in this method, a silicon nitride film is formed in place of the first oxynitride film. However, similar effects are obtained. The silicon nitride film, for which a single gas composed of ammonia is used, is easily fabricated. Further, the silicon nitride film is located farther from the silicon interface than the oxynitride film. Therefore, even if electron trapping due to nitridation using ammonia takes place in the silicon nitride film, it will hardly affect the device characteristics.

In either of the above embodiments, during periods of transition from one step to another for forming each film, the ambient may be changed over to an inert gas.

In this case, slight oxidation which would otherwise occur during the transition periods, is suppressed. Accordingly, variations of film thickness of the films are reduced, and scattering of nitrogen concentration in each oxynitride film is also reduced. Further, during the periods, inclusion of hydrogen atoms from the ambient into the already formed films is also reduced, so that device deteriorations caused by hydrogen, such as generation of the interface trap, electron trapping or the like, are suppressed.

In forming the first silicon oxide film, a temperature at which the wafer is heated may be set to between 300° C. and 700° C.

In this case, during the process of forming the first silicon oxide film, the silicon surface is oxidized slowly. Accordingly, the interface between the first silicon oxide film and the substrate silicon becomes even flatter, so that the first silicon oxide film becomes more uniform in film thickness. The reason why the lower limit of temperature is 300° C. is to obtain a practical level of rate of oxidation.

In forming each silicon oxide film, the ambient may be placed under a pressure lower than an atmospheric pressure.

With this arrangement, it is possible to achieve each silicon oxide film on one atomic layer basis. That is, atomic layers constituting each silicon oxide film are formed one by one. This makes it possible to ensure the flatness of the interface as well as the uniformity of film thickness of the oxide films. Further, variations in film thickness and nitrogen concentration of the oxynitride film to be formed in the subsequent step are reduced.

In forming the first silicon oxide film, one of steam ($H_2O$), ozone ($O_3$), oxygen containing steam and/or ozone ($H_2O/O_2$, $O_3/O_2$) may be used for the ambient.

In this case, the first silicon oxide film is formed compact in structure by virtue of the presence of oxidizing species with small particle size, as compared with the case where the oxidation is performed only with oxygen molecules. Hence, the interface between the first silicon oxide film and the substrate silicon can be bettered in flatness. Accordingly, variations in film thickness and nitrogen concentration of the oxynitride film to be formed in the subsequent step are reduced.

In forming each oxynitride film, an ambient composed of one or more gases selected from a group consisting of nitrogen monoxide (NO), dinitrogen monoxide ($N_2O$) and nitrogen dioxide ($NO_2$) may be used. In this case, the oxynitride film is formed easily.

In the method wherein the first and second oxynitride films are formed, an ambient composed of one or more gases selected from a group consisting of nitrogen monoxide, dinitrogen monoxide, nitrogen dioxide, and ammonia may be used in forming the first oxynitride film.

In this case, the first oxynitride film is easily formed. Furthermore, even if electron trapping due to nitridation using ammonia takes place in the first oxynitride film, which is located farther from the silicon surface than the second oxynitride films, that will hardly adversely affect the device characteristics. Therefore, ammonia can be used for the ambient for forming the first oxynitride film.

In forming each of the second and third silicon oxide films, one of ozone ($O_3$) and oxygen containing ozone ($O_3/O_2$) may be used for the ambient.

Monatomic oxygen dissociated from the ozone will be easily diffused in the oxynitride films and will easily react with silicon without being so much affected by the nitrogen atoms present in the oxynitride films, as compared with oxygen molecules. Accordingly, the second and third silicon oxide films can be formed into a substantially uniform film thickness without being so much affected by scattering of nitrogen concentration of the oxynitride film already formed.

Note that use of steam ($H_2O$) for the ambient for forming the second and third silicon oxide films would cause a large amount of electron traps to be formed in the vicinity of the interface between the films formed and the substrate silicon, although the diffusion coefficient is large. Thus, steam is not preferable in terms of the long-term reliability of the devices.

In forming each of the second and third silicon oxide films, the ambient may be placed under a pressure lower than an atmospheric pressure, and a temperature at which the wafer is heated may be set to between 700° C. and 1200° C.

In this case, because the temperature at which the wafer is heated is set to 700° C. or more when forming the second and third silicon oxide films, the coefficient of diffusion of oxidizing species in the oxynitride films increases. Accordingly, the second and third silicon oxide films can be formed into a uniform film thickness without being so much affected by a scatter, if any, of nitrogen concentration of the already formed oxynitride film.

It is noted that the reason why the pressure of the ambient is set lower than the atmospheric pressure is to allow a high heating temperature to be used while maintaining an appropriate rate of oxidation. Also, the reason why the upper limit temperature for heating the wafer is set to 1200° C. is to prevent the rate of oxidation from becoming too large.

In forming the first oxynitride film and in forming the second oxynitride film, a pressure of the ambient, a temperature at which the wafer is heated, and/or a time for which the wafer is heated, may be adjusted such that the first oxynitride film has a nitrogen concentration higher than that of the second oxynitride film.

With this method, the nitrogen concentration of the first oxynitride film becomes higher than that of the second oxynitride film. Since the nitrogen concentration of the first oxynitride film, which is located farther from the silicon surface than the second oxynitride film, is relatively high, device degradations due to the so-called boron penetration and/or hot-carrier-induced-device-degradations related to the diffusion of hydrogen from inter-layer dielectric films are effectively prevented from increase. Also, thanks to a relatively small nitrogen concentration of the second oxynitride film, it is possible to effectively suppress the above-described problems accompanying the oxynitridation, such as changes in strain at the $Si/SiO_2$ interface, increases in hole traps due to chemical species related to nitrogen such as $Si_2$=NH, or decreases in the carrier mobility in regions having low electric fields in directions vertical to the MOS interface.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 5 is a chart showing a heating cycle employed to form gate dielectric films by the method of the first embodiment;

FIG. 6 is a chart showing a heating cycle employed to form gate dielectric films by the method of the second embodiment;

FIG. 7 is a chart showing a heating cycle employed to form gate dielectric films by the method of the third embodiment;

DETAILED DESCRIPTION OF THE PREFERRED EMBODIMENTS

Hereinbelow, embodiments of the present invention are described in detail.

Figure 9:
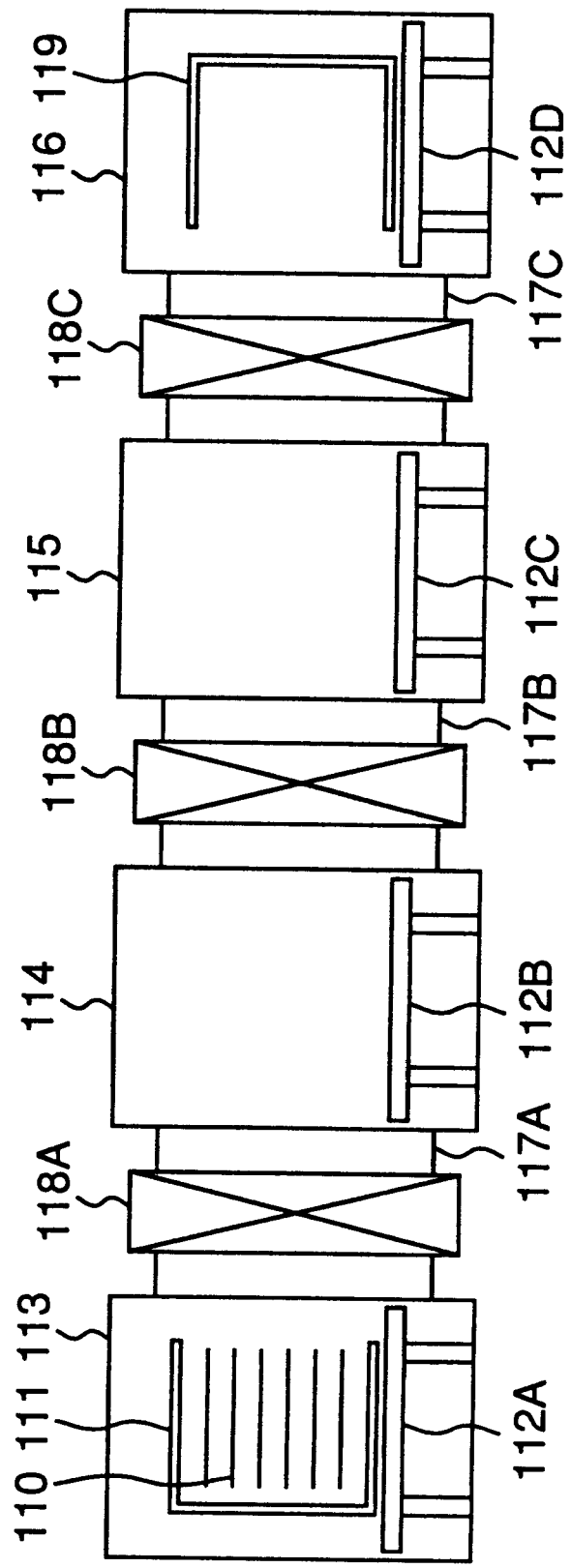
FIG. 9 schematically illustrates an apparatus appropriate for carrying out the gate dielectric film forming method of the present invention.
Figure 10A:
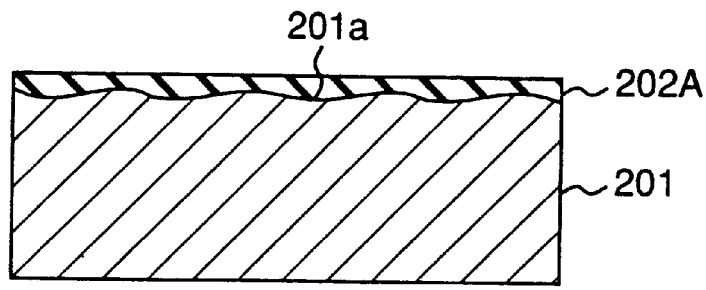
FIGS. 10A, 10B, 10C and 10D are sectional views of a wafer for explaining the mechanism of increase in the film thickness non-uniformity and interface roughness of a gate dielectric film formed by a gate dielectric film forming method of prior art.
Figure 10B:
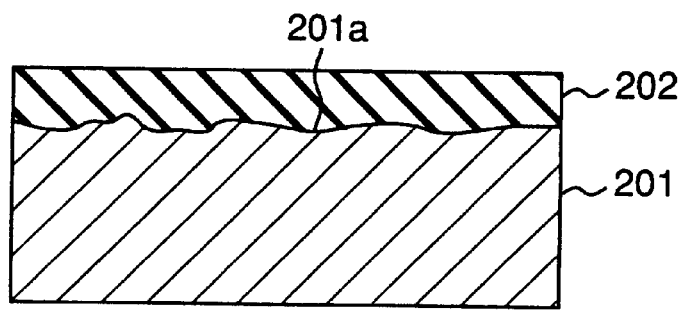
Figure 10C:
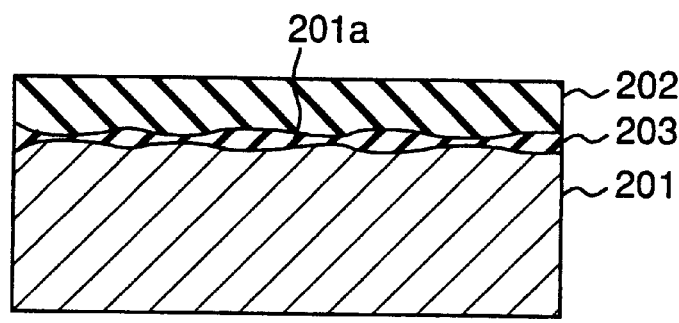
Figure 10D:
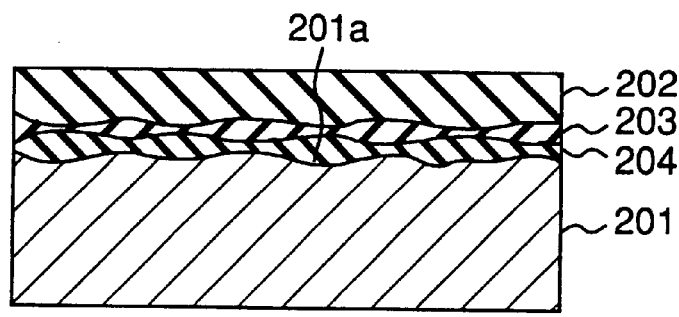

First, equipment suitably configured to carry out the gate dielectric film forming method of the present invention is explained. FIG. 9 schematically shows the configuration of such equipment.

This equipment comprises a pre-processing cassette chamber 113, a cleaning chamber 114, an oxidizing and oxynitriding chamber 115, and a post-processing cassette chamber 116. The pre-processing cassette chamber 113 and the post-processing cassette chamber 116 are provided with stages 112A, 112D for placing thereon carriers 111, 119, respectively. The cleaning chamber 114 and the oxidizing and oxynitriding chamber 115 are provided with stages (or wafer holders) 112B, 112C, respectively, for placing or holding thereon wafers 110. The chambers 113, 114, 115, 116 are coupled with one another via passages 117A, 117B, 117C, respectively. The passages 117A, 117B, 117C are equipped with valves 118A, 118B, 118C which shut off the passages 117A, 117B, 117C, respectively, so that pressure and ambient in the chambers 113, 114, 115, 116 can be controlled independently of one another. In addition, this equipment may be designed so as to process the wafers 110 one by one or plurally.

The pre-processing cassette chamber 113 is opened with the valve 118A closed, and the wafers 110 contained in the carrier 111 are placed, as they are, in the preprocessing cassette chamber 113. In this state, by substituting an inert gas such as nitrogen gas or argon gas or by producing a high vacuum, the interior of the preprocessing cassette chamber 113 is made into an ambient with oxygen and water contents minimized (more specifically, to a molecular concentration of $10^{12}$ cm$^{-3}$ or less, preferably $10^{11}$ cm$^{-3}$ or less).

After the interior of the cleaning chamber 114 has been made into an ambient with the oxygen and water contents minimized to a molecular concentration of $10^{12}$ cm$^{-3}$ or less, preferably $10^{11}$ cm$^{-3}$ or less by substituting an inert gas such as nitrogen gas or argon gas or by producing a high vacuum, the wafers 110 placed in the pre-processing cassette chamber 113 are transferred to the cleaning chamber 114 through the passage 117A. In the cleaning chamber 114, wet or dry cleaning is carried out, by which silicon surfaces of the wafers 110 are made into a clean state without any naturally oxidized film. For wet cleaning or atmospheric-pressure dry cleaning, because the interior of the cleaning chamber 114 is made into an inert gas ambient, the interior of the pre-processing cassette chamber 113 is also replaced with an inert gas beforehand. In the case of low-pressure dry cleaning, because the cleaning chamber 114 will be evacuated, the pre-processing cassette chamber 113 is also evacuated beforehand.

After the cleaning process, the wafers 110 are transferred to the oxidizing and oxynitriding chamber 115 through the passage 117B. Therefore, prior to the transfer, the interior of the oxidizing and oxynitriding chamber 115 is made into an ambient with the oxygen and water contents minimized (more specifically, to a molecular concentration of $10^{12}$ cm$^{-3}$ or less, preferably $10^{11}$ cm$^{-3}$ or less), beforehand, by substituting an inert gas such as nitrogen gas or argon gas or by producing a high vacuum. By making both the cleaning chamber 114 and the oxidizing and oxynitriding chamber 115 into an inert gas ambient or a high vacuum, it is possible to accommodate the wafers 110 in the oxidizing and oxynitriding chamber 115 without exposure to the air. The oxidizing and oxynitriding chamber 115 may be of either resistance-heating type or lamp-heating type. It is noted that the oxidizing and oxynitriding chamber 115 is capable of oxidation and oxynitridation processes even at a low pressure. Further, in the case of the oxidizing and oxynitriding chamber 115 designed to process the wafers one by one, its small volume allows the ambient to be replaced fast so that the film thickness controllability is improved.

After the oxidizing and oxynitriding processes, the wafers 110 are transferred to the post-processing cassette chamber 116 through the passage 117C. The wafers 110 are taken out of the post-processing cassette chamber 116 with the valve 118C closed and with the post-processing cassette chamber 116 at a atmospheric pressure.

The equipment of FIG. 9 is intended to carry out the processes up to the formation of gate dielectric films (oxidation and oxynitridation). However, the equipment is not limited to this arrangement. Providing the equipment with a CVD (Chemical Vapor Deposition) chamber along with a further passage (having a valve) between the oxidizing and oxynitriding chamber 115 and the post-processing cassette chamber 116 makes it possible to process the wafers up to the formation of gate electrodes without exposing the wafers 110 to the air.

(First Embodiment)

Figure 1A:
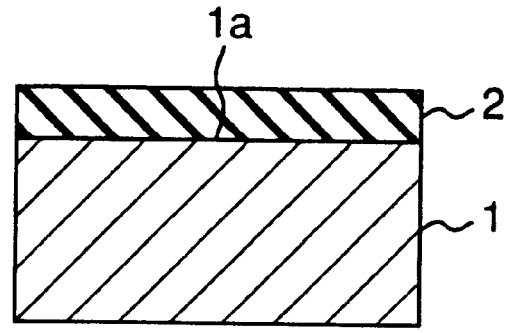
FIGS. 1A, 1B and 1C are sectional views of a wafer during the process of forming gate dielectric films by the gate dielectric film forming method of a first embodiment.
Figure 1B:
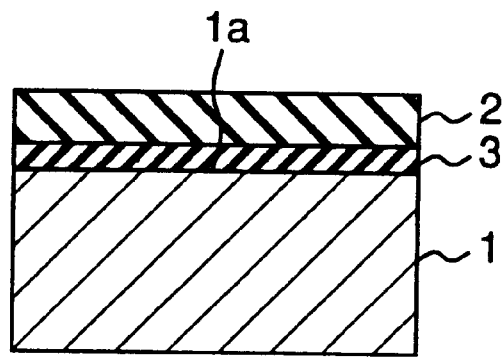
Figure 1C:
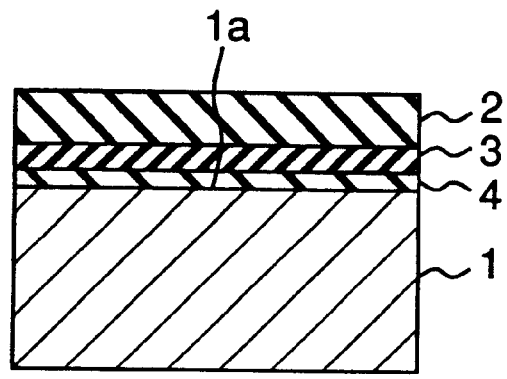

FIGS. 1A to 1C show a wafer section during the process of forming gate dielectric films in a first embodiment. FIG. 5 shows a heating cycle of the process. In this embodiment, a resistance-heating oxidizing furnace (reaction tube) is used as the oxidizing and oxynitriding chamber 115, and the heating cycle is shown with the furnace temperatures on the vertical axis and the processing times on the horizontal axis. A monocrystalline silicon substrate 1 is used for the wafer. Hereinbelow, the gate dielectric film forming method of this embodiment is explained referring to FIGS. 1A to 1C, FIG. 5 and FIG. 9.

(1) First, the silicon substrate 1 is transferred from the pre-processing cassette chamber 113 to the cleaning chamber 114. In the cleaning chamber 114, a surface 1a of the silicon substrate 1 shown in FIG. 1A is cleaned in an ambient whose oxygen and water contents have been already minimized by substituting an inert gas such as nitrogen gas ($N_2$) or argon gas (Ar), or by producing a high vacuum of $10^{-4}$ to $10^{-6}$ Pa. As a result, the surface 1a of the silicon substrate 1 is made into a clean state having no naturally oxidized films. Subsequently, the silicon substrate 1 is transferred from the cleaning chamber 114 through the passage 117A into the oxidizing and oxynitriding reaction tube 115, which has previously been made into the same ambient as the cleaning chamber 114, and the silicon substrate 1 is placed there.

(2) Next, the furnace temperature is increased while the silicon substrate 1 is retained in the ambient with the minimized oxygen and water contents of the reaction tube 115 (V1 in FIG. 5). This suppresses the formation of poor-quality oxide films due to oxidation during the temperature increase, so that a clean silicon surface free from any naturally oxidized films is maintained. It is noted that because the furnace temperature is below 700° C., the surface of the silicon substrate 1 will not be nitrided even in a nitrogen gas ambient. Subsequently, the ambient in the reaction tube 115 is replaced with an oxidizing gas containing no nitrogen at a temperature of 300° C.–700° C., whereby a first silicon oxide film 2 is formed on the surface 1a of the silicon substrate 1 as shown in FIG. 1A (H1 in FIG. 5) Since the first silicon oxide film 2 is formed on the silicon surface 1a having no naturally oxidized film, the film thickness of the first silicon oxide film 2 is controllable to be uniform, while the interface 1a between the first silicon oxide film 2 and the substrate silicon 1 can be made flat. Also, setting the heating temperature to below 700° C. allows the silicon surface 1a to be oxidized slowly. In particular, setting the pressure of the ambient to a low pressure of 1 Pa or less makes it possible to achieve a layered oxidation on one atomic layer basis. Further, using steam ($H_2O$), ozone ($O_3$) or an oxygen gas containing either of those ($H_2O/O_2$, $O_3/O_2$) for the above ambient allows the first silicon oxide film 2 to be formed compact by virtue of the presence of oxidative species with small particle size, as compared with the case where the oxidation is performed only with oxygen molecules. In addition to this, the interface 1a between the first silicon oxide film 2 and the substrate silicon 1 can be bettered in flatness. It is noted that, because these ambients show high oxidation rates, there is a need of setting a low pressure of 1 Pa or less to achieve a layered oxidation.

In this way, the first silicon oxide film 2 is reduced in scattering of film thickness, and the interface 1a between the first silicon oxide film 2 and the substrate silicon 1 is made flat. In order to obtain a desired total thickness of the dielectric films, pressure and time are adjusted primarily in this oxidation process.

(3) Next, the ambient in the reaction tube 115 is replaced with an inert gas, such as nitrogen gas ($N_2$) or argon gas (Ar), with minimized oxygen and water contents, and the furnace temperature is increased (V2 in FIG. 5). As a result, it is possible to suppress slight oxidation of the substrate which may occur during the transition to the next process. Such suppression of oxidation not only reduces a scatter of the film thickness and the nitrogen concentration of an oxynitride film to be next formed, but also decreases an amount of hydrogen atoms included in the first silicon oxide film 2. Therefore, device deteriorations caused by hydrogen, such as generation of the interface trap, electron trapping or the like, are suppressed.

Subsequently, the ambient in the reaction tube 115 is replaced with an oxidizing gas containing nitrogen at a temperature of 900–1100° C., to form a first oxynitride film 3 with film thickness 1–5 nm between the first silicon oxide film 2 and the substrate silicon 1 as shown in FIG. 1B (H2 in FIG. 5). For the ambient, nitrogen monoxide (NO), dinitrogen monoxide ($N_2O$), nitrogen dioxide ($NO_2$) or the like is used. The pressure of the ambient may be either an atmospheric pressure or a low pressure. In addition, the above thickness range of the first oxynitride film 3 is appropriate for realizing nitrogen concentrations of 0.5–3 atom %.

Since the variation, or scattering, of film thickness of the first silicon oxide film 2 is very narrow and the interface 1a between the first silicon oxide film 2 and the substrate silicon 1 has been made flat as described above, the first oxynitride film 3 can also be fabricated with narrow scattering of film thickness and of nitrogen concentration.

(4) Next, the ambient in the reaction tube 115 is replaced with an inert gas with minimized oxygen and water contents, such as nitrogen gas ($N_2$) or argon gas (Ar), and the furnace temperature is lowered (V3 in FIG. 5). As a result, it is possible to suppress slight oxidation of the substrate which may occur during the time of transition to the next process.

Subsequently, the ambient in the reaction tube 115 is replaced with an oxidizing gas containing no nitrogen at a temperature of 700–850° C. to form a second silicon oxide film 4 with a film thickness of 1–5 nm between the first oxynitride film 3 and the substrate silicon 1 as shown in FIG. 1C (H3 in FIG. 5). For the ambient, ozone ($O_3$) or an oxygen gas containing ozone ($O_3/O_2$) is used, and the pressure of the ambient is set to a low pressure of 1 Pa or less. The thickness range of the second silicon oxide film 4 is appropriate for reducing hole traps that have been increased by oxynitridation, and the oxidizing temperature is within such a range that a good film quality can be obtained in this film thickness range.

As described above, scattering, or variation, of film thickness of the first silicon oxide film 2 and hence of the first oxynitride film 3 are very narrow. Also, scattering of nitrogen concentration of the first oxynitride film 3 is very narrow. Therefore, the second silicon oxide film 4 can also be fabricated with narrow scattering of film thickness, so that the interface 1a between the second silicon oxide film 4 and the substrate silicon 1 becomes flattened.

Further, monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the second silicon oxide film 4 is formed into a uniform film thickness without being so much affected by variations in nitrogen concentration, if any, of the first oxynitride film 3 that has already been formed. It is noted that the reason why the ambient is set to a low pressure of 1 Pa or less is to lower the rate of oxidation without lowering the diffusion coefficient of oxidizing species and to thereby improve the film thickness controllability.

(5) After this, the ambient in the reaction tube 115 is replaced with an inert gas such as nitrogen gas ($N_2$) or argon gas (Ar) with oxygen and water contents minimized, and the furnace temperature is lowered (V4 in FIG. 5). After a sufficient temperature decrease, the silicon substrates 1 are transferred from the reaction tube 115 to the post-processing cassette chamber 116 through the passage 117C. Then, the valve 118C is closed and the post-processing cassette chamber 116 is put into atmospheric pressure, in which state the silicon substrates 1 are taken out of the chamber 116. Thus, the formation of the gate dielectric films is completed.

In this embodiment, variation in film thickness of the first and second silicon oxide films 2, 4 has been reduced, variation in film thickness and nitrogen concentration of the first oxynitride film 3 has been reduced, and moreover the interface 1a between the second silicon oxide film 4 and the substrate silicon 1 has been made flat. As a result, variation in film thickness of the gate dielectric films as a whole can be reduced, as compared with the conventional counterpart, so that the dielectric breakdown withstand voltage of the gate dielectric films can be improved. Also, since the film thickness of the second silicon oxide film 4 is able to be set to 1 nm or more without impairing the film thickness uniformity or interface flatness of the whole gate dielectric films, it becomes possible to solve various problems caused by oxynitridation, such as changes in strain of the $Si/SiO_2$ interface, increases in hole traps due to chemical species related to nitrogen such as $Si_2$=NH, or decreases in the carrier mobility in regions having low electric fields in directions vertical to the MOS interface.

(Second Embodiment)

Figure 2A:
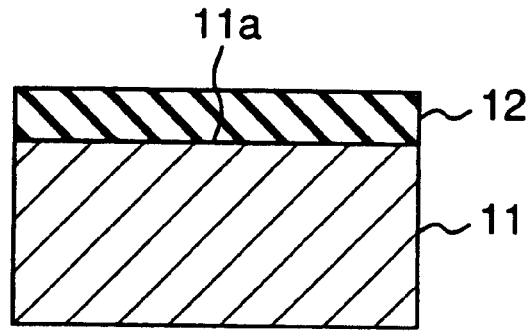
FIGS. 2A, 2B and 2C are sectional views of a wafer during the process of forming gate dielectric films by the gate dielectric film forming method of a second embodiment.
Figure 2B:
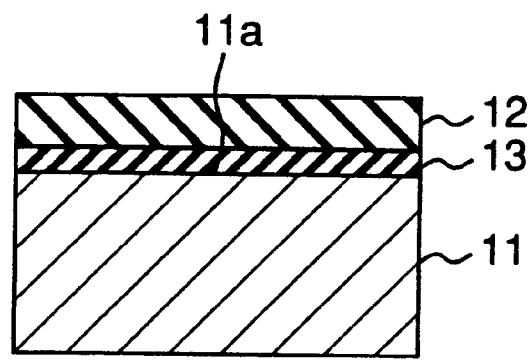
Figure 2C:
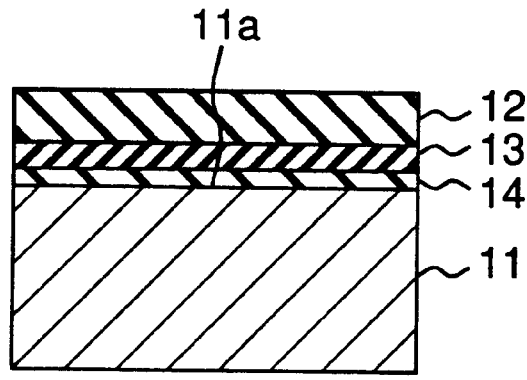

FIGS. 2A to 2C show a wafer section during the process of forming a gate dielectric film in a second embodiment. FIG. 6 shows a heating cycle of the process. In this embodiment, a lamp-heated type oxidizing furnace (reaction tube) is employed as the oxidizing and oxynitriding chamber 115, and the heating cycle is shown with wafer temperatures (measured by an optical pyrometer or the like) represented on the vertical axis and with processing times represented on the horizontal axis. A monocrystalline silicon substrate 11 is used as the wafer. Hereinbelow, the gate dielectric film forming method of this embodiment is explained by referring to FIGS. 2A to 2C, FIG. 6 and FIG. 9.

(1) First, the silicon substrate 11 is transferred from the pre-processing cassette chamber 113 to the cleaning chamber 114. In the cleaning chamber 114, a surface 11a of the silicon substrate 11 shown in FIG. 2A is cleaned in an ambient having oxygen and water contents minimized by previously substituting an inert gas such as nitrogen gas ($N_2$)

or argon gas (Ar), or by producing a high vacuum of $10^{-4}$ to $10^{-6}$ Pa. As a result, the surface 11a of the silicon substrate 11 is made into a clean state without even naturally oxidized films. Subsequently, the silicon substrate 11 is transferred from the cleaning chamber 114 through the passage 117A to the oxidizing and oxynitriding reaction tube 115, which has previously been made into the same ambient as the cleaning chamber 114, and the silicon substrate 11 is placed there.

(2) Next, the silicon substrate 11 temperature is raised by lamp heating while the silicon substrate 11 is retained in the ambient of the reaction tube 115 (V1 in FIG. 6). This suppresses the formation of a poor-quality oxide film due to oxidation during the temperature rise, so that a clean silicon surface free from any naturally oxidized films is maintained. It is noted that because the furnace temperature is below 700° C., the surface of the silicon substrate 11 will not be nitrided even in a nitrogen gas ambient. Also, the lamp-heated type oxidizing furnace allows the temperature increase (as well as the temperature decrease) to be attained in shorter time, as compared with the resistance-heating type oxidizing furnace, so that oxidation of the substrate can be further suppressed. Subsequently, the ambient in the reaction tube 115 is replaced with an oxidizing gas containing no nitrogen at a temperature of 300–700° C. Thus, a first silicon oxide film 12 is formed at the surface 11a of the silicon substrate 11 as shown in FIG. 2A (H1 in FIG. 6). Since the first silicon oxide film 12 is formed at the silicon surface 11a that has no naturally oxidized films, the first silicon oxide film 12 becomes uniform in film thickness, while the interface 11a between the first silicon oxide film 12 and the substrate silicon 11 is made flat. Also, setting the heating temperature to below 700° C. allows the silicon surface 11a to be oxidized slowly. In particular, setting the pressure of the ambient to a low pressure of 1 Pa or less makes it possible to achieve a layered oxidation on a single atomic layer basis. Further, using steam ($H_2O$), ozone ($O_3$) or an oxygen gas containing these ($H_2O/O_2$, $O_3/O_2$) for the above ambient allows the first silicon oxide film 12 to be formed compact by virtue of the presence of oxidative species with small particle size, as compared with the case where the oxidation is performed only with oxygen molecules. In addition to this, the interface 11a between the first silicon oxide film 12 and the substrate silicon 11 can be bettered in flatness. It is noted that, because these ambients show high oxidation rates, there is a need of setting the pressure to as low as 1 Pa or less to achieve a layered oxidation.

In this way, the first silicon oxide film 12 is reduced in variation in film thickness, and the interface 11a between the first silicon oxide film 12 and the substrate silicon 11 is made flat. In order to obtain a desired total thickness of the dielectric films, pressure and time are adjusted primarily in this oxidation process.

(3) Next, the ambient in the reaction tube 115 is replaced with an inert gas, such as an nitrogen gas ($N_2$) or argon gas (Ar), with minimized oxygen and water contents, and the temperature of the silicon substrate 11 is decreased by air cooling, and thereafter raised by lamp heating once again (V2 in FIG. 6). As a result, it is possible to suppress slight oxidation of the substrate which may occur during the transition to the next process. Such suppression of oxidation not only reduces a scatter of film thickness of an oxynitride film to be next formed and a scatter of nitrogen concentration of the film, but also decreases an amount of hydrogen atoms included in the first silicon oxide film 12. Therefore, device deteriorations caused by hydrogen, such as generation of the interface trap, electron trapping or the like, can be suppressed. Further, since the lamp-heated type oxidizing furnace allows the temperature increase and decrease to be attained in shorter time, as compared with the resistance-heating type oxidizing furnace, oxidation is further suppressed and the inclusion of hydrogen atoms is reduced.

Subsequently, the ambient in the reaction tube 115 is replaced with an oxidizing gas containing nitrogen at a temperature of 1000–1200° C. to form a first oxynitride film 13 with film thickness 1–5 nm between the first silicon oxide film 12 and the substrate silicon 11 as shown in FIG. 2B (H2 in FIG. 6) For the ambient, nitrogen monoxide (NO), dinitrogen monoxide ($N_2O$), nitrogen dioxide ($NO_2$) or the like is used. The pressure of the ambient may be either an atmospheric pressure or a low pressure. In addition, the above thickness range of the first oxynitride film 13 is appropriate for realizing nitrogen concentrations of 0.5–3 atom %.

Since the variation, or scattering, of film thickness of the first silicon oxide film 12 is very narrow and the interface 11a between the first silicon oxide film 12 and the substrate silicon 11 has been made flat as described above, the first oxynitride film 13 can also be fabricated with narrow scattering of film thickness and of nitrogen concentration.

(4) Next, the ambient in the reaction tube 115 is replaced with an inert gas, such as nitrogen gas ($N_2$) or argon gas (Ar), with minimized oxygen and water contents, and the temperature of the silicon substrate 11 is decreased by air cooling, and thereafter increased by lamp heating once again (V3 in FIG. 6). As a result, it is possible to suppress slight oxidation of the substrate which may occur during the transition to the next process.

Subsequently, the ambient in the reaction tube 115 is replaced with an oxidizing gas containing no nitrogen at a temperature of 700–1000° C. to form a second silicon oxide film 14 with a film thickness of 1–5 nm between the first oxynitride film 13 and the substrate silicon 11 as shown in FIG. 2C (H3 in FIG. 6). For the ambient, ozone ($O_3$) or an oxygen gas containing ozone ($O_3/O_2$) is used, and the pressure of the ambient is set to as low as 1 Pa or less. The above range of film thickness of the second silicon oxide film 14 is appropriate for reducing hole traps that have been increased by oxynitridation, and the oxidizing temperature is within such a range that a good film quality can be obtained in this film thickness range.

As described above, scattering, or variation, of film thickness of the first silicon oxide film 12 and hence of the first oxynitride film 13 are very narrow. Also, scattering of nitrogen concentration of the first oxynitride film 13 is very narrow. Therefore, the second silicon oxide film 14 can also be fabricated with narrow scattering of film thickness, so that the interface 11a between the second silicon oxide film 14 and the substrate silicon 11 becomes flattened.

Further, monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the second silicon oxide film 14 is formed into a uniform film thickness without being so much affected by variations in nitrogen concentration, if any, of the first oxynitride film 13 that has already been formed. It is noted that the reason why the ambient is set to a low pressure of 1 Pa or less is to lower the rate of oxidation without lowering the diffusion coefficient of oxidizing species and to thereby improve the film thickness controllability.

(5) After this, the ambient in the reaction tube 115 is replaced with an inert gas, such as nitrogen gas ($N_2$) or argon gas (Ar), with minimized oxygen and water contents, and the temperature of the silicon substrate 11 is decreased by air cooling (V4 in FIG. 6). After a sufficient temperature decrease, the silicon substrate 11 is transferred from the reaction tube 115 to the post-processing cassette chamber 116 through the passage 117C. Then, the valve 118C is closed and the post-processing cassette chamber 116 is put into atmospheric pressure, in which state the silicon substrate 11 is taken out. Thus, the formation of the gate dielectric film is completed.

In this way, variation in film thickness of the first and second silicon oxide films 12, 14 has been reduced, variation in film thickness and nitrogen concentration of the first oxynitride film 3 has been reduced, and moreover the interface 1a between the second silicon oxide film 14 and the substrate silicon 11 has been made flat. As a result, variation in film thickness of the gate dielectric films as a whole can be reduced, as compared with the conventional counterpart, so that the dielectric breakdown withstand voltage of the gate dielectric films can be improved. Also, since the film thickness of the second silicon oxide film 14 is able to be set to 1 nm or more without impairing the film thickness uniformity or interface flatness of the whole gate dielectric films, it becomes possible to solve various problems caused by oxynitridation, such as changes in strain of the $Si/SiO_2$ interface, increases in hole traps due to chemical species related to nitrogen such as $Si_2$=NH, or decreases in the carrier mobility in regions having low electric fields in directions vertical to the MOS interface.

(Third Embodiment)

FIGS. 3A to 3E show a wafer section during the process of forming a gate dielectric film in a third embodiment. FIG. 7 shows a heating cycle of the process. In this embodiment, a resistance-heating oxidizing furnace (reaction tube) is used as the oxidizing and oxynitriding chamber 115, and the heating cycle is shown with the furnace temperatures on the vertical axis and the processing times on the horizontal axis. A monocrystalline silicon substrate 21 is used for the wafer. Hereinbelow, the gate dielectric film forming method of this embodiment is explained referring to FIGS. 3A to 3E, FIG. 7 and FIG. 9.

Figure 3A:
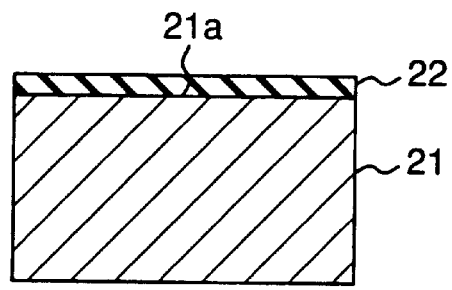
FIGS. 3A, 3B, 3C, 3D and 3E are sectional views of a wafer during the process of forming gate dielectric films by the gate dielectric film forming method of a third embodiment.

(1) First, the silicon substrate 21 is transferred from the pre-processing cassette chamber 113 to the cleaning chamber 114. In the cleaning chamber 114, a surface 21a of the silicon substrate 21 shown in FIG. 3A is cleaned in an ambient whose oxygen and water contents have been already minimized by substituting an inert gas such as nitrogen gas ($N_2$) or argon gas (Ar), or by producing a high vacuum of $10^{-4}$ to $10^{-6}$ Pa. As a result, the surface 21a of the silicon substrate 21 is made into a clean state having no naturally oxidized films. Subsequently, the silicon substrate 21 is transferred from the cleaning chamber 114 through the passage 117A into the oxidizing and oxynitriding reaction tube 115, which has previously been made into the same ambient as the cleaning chamber 114, and the silicon substrate 21 is placed there.

(2) Next, the furnace temperature is increased while the silicon substrate 21 is retained in the ambient of the reaction tube 115 (V1 in FIG. 7). This suppresses the formation of poor-quality oxide films due to oxidation during the temperature increase, so that a clean silicon surface free from any naturally oxidized films is maintained. It is noted that because the furnace temperature is below 700° C., the surface of the silicon substrate 21 will not be nitrided even in a nitrogen gas ambient. Subsequently, the ambient in the reaction tube 115 is replaced with an oxidizing gas containing no nitrogen at a temperature of 300–700° C., whereby a first silicon oxide film 22 is formed on the surface 21a of the silicon substrate 21 as shown in FIG. 3A (H1 in FIG. 7). Since the first silicon oxide film 22 is formed on the silicon surface 21a having no naturally oxidized film, the film thickness of the first silicon oxide film 22 is controllable to be uniform, while the interface 21a between the first silicon oxide film 22 and the substrate silicon 21 can be made flat. Also, setting the heating temperature to below 700° C. allows the silicon surface 21a to be oxidized slowly. In particular, setting the pressure of the ambient to as low as 1 Pa or less makes it possible to achieve a layered oxidation on one atomic layer basis. Further, using steam ($H_2O$), ozone ($O_3$) or an oxygen gas containing either of those ($H_2O/O_2$, $O_3/O_2$) for the above ambient allows the first silicon oxide film 22 to be formed compact by virtue of the presence of oxidative species with small particle size, as compared with the case where the oxidation is performed only with oxygen molecules. In addition to this, the interface 21a between the first silicon oxide film 22 and the substrate silicon 21 can be bettered in flatness. It is noted that, because these ambients show high oxidation rates, there is a need of setting the pressure at as low pressure as 1 Pa or less to achieve a layered oxidation.

In this way, the first silicon oxide film 22 is reduced in scattering of film thickness, and the interface 21a between the first silicon oxide film 22 and the substrate silicon 21 is made flat. In addition, the pressure and the processing time are adjusted such that the thickness of the first silicon oxide film 22 falls in a range of 0.3–1.0 nm.

Figure 3B:
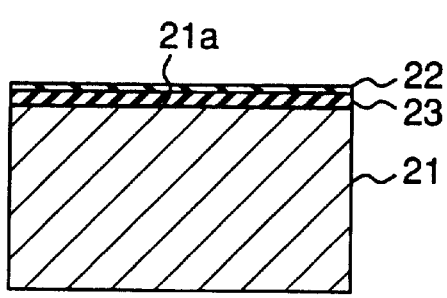

(3) Next, the ambient in the reaction tube 115 is replaced with an inert gas such as nitrogen gas ($N_2$) or argon gas (Ar) with its oxygen and water contents minimized, and the furnace temperature is increased (V2 in FIG. 7). Subsequently, the ambient in the reaction tube 115 is replaced with an oxidizing gas containing nitrogen at a temperature of 900–1100° C., to form a first oxynitride film 23 with film thickness 1–5 nm between the first silicon oxide film 22 and the substrate silicon 21 as shown in FIG. 3B (H2 in FIG. 7). For the ambient, nitrogen monoxide (NO), dinitrogen monoxide ($N_2O$), nitrogen dioxide ($NO_2$) or the like may be used. The pressure of the ambient may be either an atmospheric pressure or a low pressure. In addition, the above thickness range of the first oxynitride film 23 is appropriate for realizing a high nitrogen concentration.

Since the variation, or scattering, of film thickness of the first silicon oxide film 22 is very narrow and the interface 21a between the first silicon oxide film 22 and the substrate silicon 21 has been made flat as described above, the first oxynitride film 23 can also be fabricated with narrow scattering of film thickness and nitrogen concentration.

The first oxynitride film 23 will finally be located farther from the silicon surface 21a than a second oxynitride film 25 described later. As a result, even if ammonia ($NH_3$) is used for the above ambient, carrier trapping due to the hydrogen atom (—H) of ammonia would hardly affect the device characteristics. Therefore, ammonia ($NH_3$) can be used as the ambient. In particular, with the ambient provided by a simple-substance gas of ammonia ($NH_3$), a silicon nitride film may also be formed in place of the first oxynitride film 23.

Figure 3C:
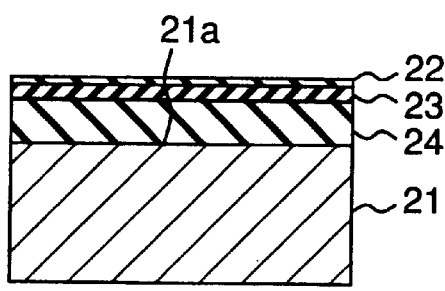

(4) Next, the ambient in the reaction tube 115 is replaced with an inert gas such as nitrogen gas ($N_2$) or argon gas (Ar) with minimized oxygen and water contents, and the furnace temperature is lowered (V3 in FIG. 7). Subsequently, the ambient in the reaction tube 115 is replaced with an oxidizing gas containing no nitrogen at a temperature of 700–850° C. to form a second silicon oxide film 24 between the first oxynitride film 23 and the substrate silicon 21 as shown in FIG. 3C (H3 in FIG. 7). For the ambient, ozone ($O_3$) or an oxygen gas containing ozone ($O_3/O_2$) is used, and the pressure of the ambient is set at as low as 1 Pa or less.

The second silicon oxide film 24 can be fabricated with narrow scattering of film thickness, so that the interface 21a between the second silicon oxide film 24 and the substrate silicon 21 becomes flattened, because the scattering, or variation, of film thickness of the first silicon oxide film 22 and hence of the first oxynitride film 23 are very narrow, and the scattering of nitrogen concentration of the first oxynitride film 23 is very narrow, as described above.

Further, monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the second silicon oxide film 24 is formed into a uniform film thickness without being so much affected by variations in nitrogen concentration, if any, of the first oxynitride film 23 that has already been formed. It is noted that the reason why the ambient is set to a low pressure of 1 Pa or less is to lower the rate of oxidation without lowering the diffusion coefficient of oxidizing species and to thereby improve the film thickness controllability. In this case, because the oxidation process is carried out at a relatively low temperature, redistribution of the nitrogen concentration profile will hardly occur. In addition, in order to obtain a desired total thickness of the dielectric films, the pressure and processing time for this oxidation are adjusted primarily.

Figure 3D:
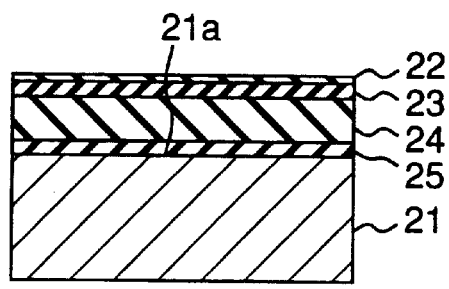
Figure 3E:
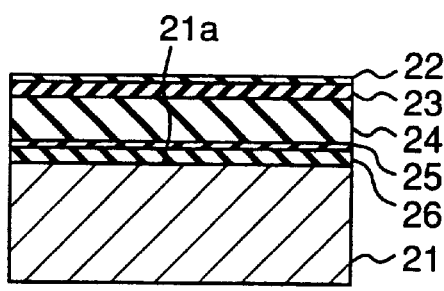

(5) Next, as in the step (3), the ambient in the reaction tube 115 is replaced with an inert gas, such as nitrogen gas ($N_2$) or argon gas (Ar), having its oxygen and water contents minimized, and the furnace temperature is increased (V4 in FIG. 7). Subsequently, the ambient in the reaction tube 115 is replaced with an oxidizing gas containing nitrogen at a temperature of 900–1100° C. to form a second oxynitride film 25 with film thickness 1–5 nm between the second silicon oxide film 24 and the substrate silicon 21 as shown in FIG. 3D (H4 in FIG. 7). For the ambient, nitrogen monoxide (NO), dinitrogen monoxide ($N_2O$), nitrogen dioxide ($NO_2$) or the like is used. The pressure of the ambient may be either atmospheric pressure or low pressure, but in the present case, the pressure or temperature is set lower than that in the formation of the first oxynitride film 23 such that the nitrogen concentration of the second oxynitride film 25 is lower than the nitrogen concentration of the first oxynitride film 23. The above thickness range of the second oxynitride film 25 is appropriate for realizing nitrogen concentrations of 0.5–3 atom %.

In addition to the reduced scatter of film thickness of the first silicon oxide film 22 and hence the reduced scatter of film thickness and nitrogen concentration of the first oxynitride film 23, the second silicon oxide film 24 also has a reduced scatter of film thickness, and the interface 21a between the second silicon oxide film 24 and the substrate silicon 21 has been flattened, as described above. As a result, the second oxynitride film 25 can be fabricated with a narrow scatter of film thickness and of nitrogen concentration.

(6) Next, as in the step (4), the ambient in the reaction tube 115 is replaced with an inert gas, such as nitrogen gas ($N_2$) or argon gas (Ar), having its oxygen and water contents minimized, and the furnace temperature is lowered (V5 in FIG. 7). Subsequently, the ambient in the reaction tube 115 is replaced with an oxidizing gas containing no nitrogen at a temperature of 700–850° C. to form a third silicon oxide film 26 with a film thickness of 1–5 nm between the second oxynitride film 25 and the substrate silicon 21 as shown in FIG. 3C (H5 in FIG. 7). For the ambient, ozone ($O_3$) or an oxygen gas containing ozone ($O_3/O_2$) is used, and the pressure of the ambient is set at as low as 1 Pa or less. The above film thickness range of the third silicon oxide film 26 is appropriate for reducing hole traps that have been increased by oxynitridation, and the oxidizing temperature is within such a range that a good film quality can be obtained in this film thickness range.

As described above, the first and second silicon oxide films 22, 24 have been reduced in scattering of film thickness, the first and second oxynitride films 23, 25 have been reduced in scattering of film thickness and nitrogen concentration, and moreover the interface 21a between the second oxynitride film 25 and the substrate silicon 21 has been made flat. As a result, the third silicon oxide film 26 can be fabricated with a reduced scatter of film thickness as well as a reduced scatter of nitrogen concentration, and the interface 21a between the third silicon oxide film 26 and the substrate silicon 21 can also be made flat.

Further, monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the third silicon oxide film 26 is formed into a uniform film thickness without being so much affected by variations in nitrogen concentration, if any, of the oxynitride films 23, 25 that have already been formed. It is noted that the reason why the ambient is set to a low pressure of 1 Pa or less is to lower the rate of oxidation without lowering the diffusion coefficient of oxidizing species and to thereby improve the film thickness controllability. In this case, because the oxidation process is carried out at a relatively low temperature, redistribution of the nitrogen concentration profile will hardly occur, as compared with ordinary dry oxidation.

(7) After this, the ambient in the reaction tube 115 is replaced with an inert gas, such as nitrogen gas ($N_2$) or argon gas (Ar), having its oxygen and water contents minimized, and the furnace temperature is lowered (V6 in FIG. 7). After a sufficient temperature decrease, the silicon substrate 21 is transferred from the reaction tube 115 to the post-processing cassette chamber 116 through the passage 117C. Then, the valve 118C is closed and the post-processing cassette chamber 116 is put into atmospheric pressure, in which state the silicon substrate 21 is taken out. At this point, the formation of the gate dielectric films is completed.

In this way, scattering of film thickness of each of the first, second and third silicon oxide films 22, 24, 26 has been reduced, scattering of film thickness and nitrogen concentration of the first and second oxynitride films 23, 25 has been reduced, and moreover the interface 21a between the third silicon oxide film 26 and the substrate silicon 21 has been made flat. As a result, variation, or scattering, of film thickness of the gate dielectric films as a whole can be reduced, as compared with the conventional counterpart, so that the dielectric breakdown withstand voltage of the gate dielectric films can be improved. Also, since the second and third silicon oxide films 24, 26 are able to be set to a film thickness of 1 nm or more without impairing the film thickness uniformity or interface flatness of the whole gate dielectric films, it becomes possible to solve various problems caused by oxynitridation, such as changes in strain of the $Si/SiO_2$ interface, increases in hole traps due to chemical species related to nitrogen such as $Si_2$=NH, or decreases in the carrier mobility in regions having low electric fields in directions vertical to the MOS interface.

Furthermore, among the first and second oxynitride films 23, 25, the first oxynitride film 23 that is farther from the silicon surface 21a has a relatively high nitrogen concentration. This allows an effective prevention of increases in device degradations due to the so-called boron penetration or hot-carrier-induced-device-degradations related to the diffusion of hydrogen from inter-layer dielectric films. Also, because of a relatively small nitrogen concentration of the second oxynitride film 25, it is possible to solve the above problems such as changes in the strain of the $Si/SiO_2$ interface, increases in hole traps due to chemical species related to nitrogen such as $Si_2$=NH, or decreases in the carrier mobility in regions having low electric fields in directions vertical to the MOS interface.

(Fourth Embodiment)

Figure 8:
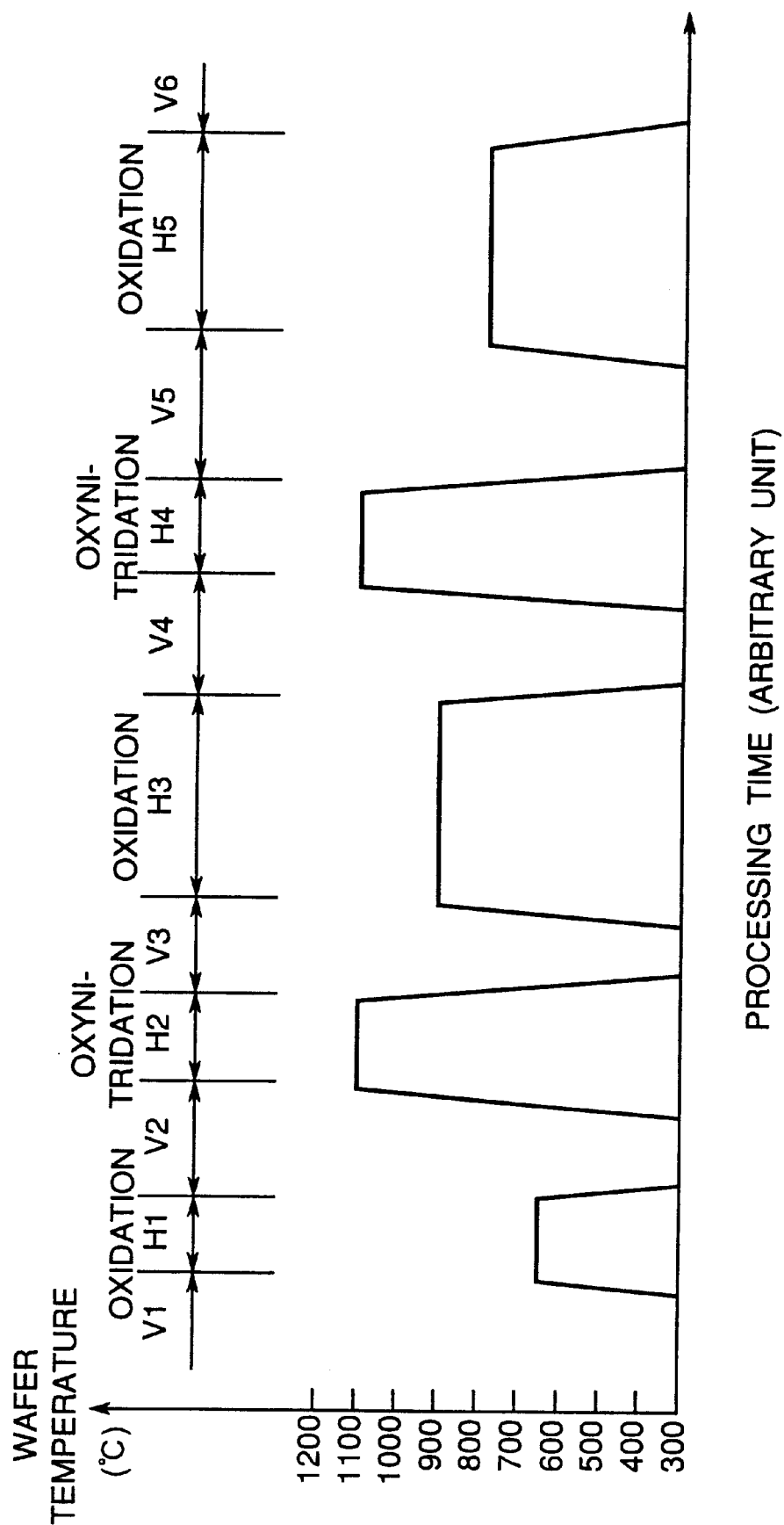
FIG. 8 is a chart showing a heating cycle employed to form gate dielectric films by the method of the fourth embodiment.

FIGS. 4A to 4E show a wafer section during the process of forming gate dielectric films in this embodiment. FIG. 8 shows a heating cycle of the process. In this embodiment, a lamp-heating type oxidizing furnace (reaction tube) is used as the oxidizing and oxynitriding chamber 115, and the heating cycle is shown with wafer temperatures (measured by an optical pyrometer or the like) represented on the vertical axis and with processing times represented on the horizontal axis. A monocrystalline silicon substrate 31 is used as the wafer. Hereinbelow, the gate dielectric film forming method of this embodiment is explained by referring to FIGS. 4A to 4E, FIG. 8 and FIG. 9.

Figure 4A:
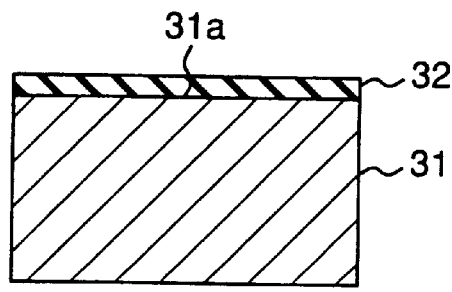
FIGS. 4A, 4B, 4C, 4D and 4E are sectional views of a wafer during the process of forming gate dielectric films by the gate dielectric film forming method of a fourth embodiment.

(1) First, the silicon substrate 31 is transferred from the pre-processing cassette chamber 113 to the cleaning chamber 114. In the cleaning chamber 114, a surface 31a of the silicon substrate 31 shown in FIG. 4A is cleaned in an ambient having its oxygen and water contents minimized by previously substituting an inert gas such as nitrogen gas ($N_2$) or argon gas (Ar), or by producing a high vacuum of $10^{-4}$ to $10^{-6}$ Pa. As a result, the surface 31a of the silicon substrate 31 is made into a clean state without even naturally oxidized films. Subsequently, the silicon substrate 31 is transferred from the cleaning chamber 114 through the passage 117A into the oxidizing and oxynitriding reaction tube 115, which has previously been made into the same ambient as the cleaning chamber 114, and the silicon substrate 31 is placed there.

(2) Next, the temperature of the silicon substrate 31 is raised by lamp heating while the silicon substrate 31 is retained in the ambient of the reaction tube 115 (V1 in FIG. 8). This suppresses the oxidation during the temperature rise, so that a clean silicon surface free from any naturally oxidized films is maintained. It is noted that because the furnace temperature is below 700° C., the surface of the silicon substrate 31 will not be nitrided even in a nitrogen gas ambient. Also, since lamp-heating type oxidizing furnace allows the temperature increase (temperature decrease) to be attained in shorter time, as compared with the resistance-heating type furnace, the oxidation can be further suppressed. Subsequently, the ambient in the reaction tube 115 is replaced with an oxidizing gas containing no nitrogen at a temperature of 300–700° C. to form a first silicon oxide film 32 on the surface 31a of the silicon substrate 31 as shown in FIG. 4A (H1 in FIG. 8). Since the first silicon oxide film 32 is formed on the silicon surface 31a that is free from any naturally oxidized film, the first silicon oxide film 32 is made uniform in film thickness, while the interface 31a between the first silicon oxide film 32 and the substrate silicon 31 is made flat. Also, setting the heating temperature to below 700° C. allows the silicon surface 31a to be oxidized slowly. In particular, setting the pressure of the ambient to as low as 1 Pa or less makes it possible to achieve a layered oxidation on one atom layer basis. Further, using steam ($H_2O$), ozone ($O_3$) or an oxygen gas containing these ($H_2O/O_2$, $O_3/O_2$) for the above ambient allows the structure of the first silicon oxide film 32 to be formed compact by virtue of the presence of oxidative species with small particle size, as compared with the case where the oxidation is performed only with oxygen molecules. Thus, the interface 31a between the first silicon oxide film 32 and the substrate silicon 31 can be bettered in flatness. It is noted that, because these ambients show high oxidation rates, there is a need of setting a low pressure of 1 Pa or less to achieve a layered oxidation.

The pressure and the processing time are adjusted so that the thickness of the first silicon oxide film 32 falls in a range of 0.3–1.0 nm.

(3) Next, the ambient in the reaction tube 115 is replaced with an inert gas, such as nitrogen gas ($N_2$) or argon gas (Ar), having its oxygen and water contents minimized, and the temperature of the silicon substrate 31 is first decreased by air cooling, and thereafter increased by lamp heating once again (V2 in FIG. 8). As a result, it is possible to suppress slight oxidation of the substrate which may occur during the transition to the next process. Such suppression of oxidation not only reduces a scatter of film thickness of an oxynitride film to be next formed and a scatter of nitrogen concentration of the film, but also decreases an amount of hydrogen atoms included in the first silicon oxide film 32. Therefore, device deteriorations caused by hydrogen, such as generation of the interface trap, electron trapping or the like, are suppressed. Further, since the lamp-heating type oxidizing furnace allows the temperature increase and decrease to be attained in shorter time, as compared with the resistance-heating type oxidizing furnace, oxidation is further suppressed and the inclusion of hydrogen atoms is reduced.

Figure 4B:
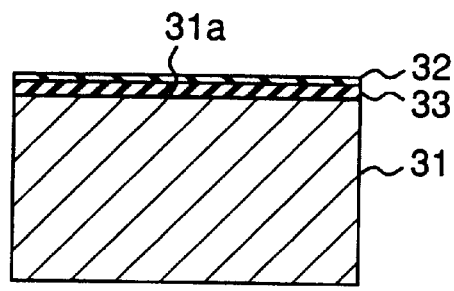

Subsequently, the ambient in the reaction tube 115 is replaced with an oxidizing gas containing nitrogen at a temperature of 1000–1200° C. to form a first oxynitride film 33 with film thickness 1–5 nm between the first silicon oxide film 32 and the substrate silicon 31 as shown in FIG. 4B (H2 in FIG. 8). For the ambient, nitrogen monoxide (NO), dinitrogen monoxide ($N_2O$), nitrogen dioxide ($NO_2$) or the like is used. The pressure of the ambient may be either an atmospheric pressure or a low pressure. In addition, the above thickness range of the first oxynitride film 33 is appropriate for realizing high nitrogen concentrations.

Since the variation, or scattering, of film thickness of the first silicon oxide film 32 is very narrow and the interface 31a between the first silicon oxide film 32 and the substrate silicon 31 has been made flat as described above, the first oxynitride film 33 can also be fabricated with narrow scattering of film thickness and nitrogen concentration.

The first oxynitride film 33 will finally be located farther from the silicon surface 31a than a second oxynitride film 35 described later. Therefore, even if ammonia ($NH_3$) is used for the above ambient, carrier trapping due to the hydrogen atom (—H) of ammonia would hardly affect the device characteristics. Therefore, ammonia ($NH_3$) may be used for the ambient. In particular, with the ambient provided by a simple-substance gas composed of ammonia, a silicon nitride film may also be formed in place of the first oxynitride film 33.

Figure 4C:
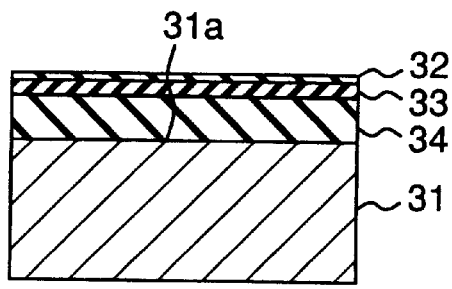

(4) Next, the ambient in the reaction tube 115 is replaced with an inert gas such as nitrogen gas ($N_2$) or argon gas (Ar) with minimized oxygen and water contents, and the temperature of the silicon substrate 31 is decreased by air cooling, and thereafter increased again by lamp heating (V3 in FIG. 8). As a result, it is possible to suppress slight oxidation of the substrate which may occur during the transition to the next process. Subsequently, the ambient in the reaction tube 115 is replaced with an oxidizing gas containing no nitrogen at a temperature of 700–1000° C. to form a second silicon oxide film 34 between the first oxynitride film 33 and the substrate silicon 31 as shown in FIG. 4C (H3 in FIG. 8). For the ambient, ozone ($O_3$) or an oxygen gas containing ozone ($O_3/O_2$) is used, and the pressure of the ambient is set to as low as 1 Pa or less.

The second silicon oxide film 34 can be fabricated with narrow scattering of film thickness, so that the interface 31a between the second silicon oxide film 34 and the substrate silicon 31 becomes flattened, because the scattering, or variation, of film thickness of the first silicon oxide film 32 and hence of the first oxynitride film 33 are very narrow, and the scattering of nitrogen concentration of the first oxynitride film 33 is very narrow, as described above.

Monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the second silicon oxide film 34 is formed into a uniform film thickness without being so much affected by variations in nitrogen concentration of the oxynitride film 33 that has already been formed. Further, since the lamp-heating type oxidizing furnace allows the oxidation to be attained at higher temperatures and in shorter time, as compared with the resistance-heating oxidizing furnace, the diffusion coefficient of oxidizing species can be further enlarged. Accordingly, the influence of scattering, or variation, of nitrogen concentration of the oxynitride film 33 that has already been formed is further reduced, so that the second silicon oxide film 34 is formed into an even more uniform film thickness. It is noted that the reason why the ambient is set to a low pressure of 1 Pa or less is to lower the rate of oxidation without lowering the diffusion coefficient of oxidizing species and to thereby improve the film thickness controllability. In the present case, the oxidation process is carried out at a relatively low temperature as compared with ordinary drying oxidation. Accordingly, redistribution of the nitrogen concentration profile will hardly occur. In order to obtain a desired total thickness of the dielectric films, the pressure and processing time for the present oxidation process should be adjusted primarily.

Figure 4D:
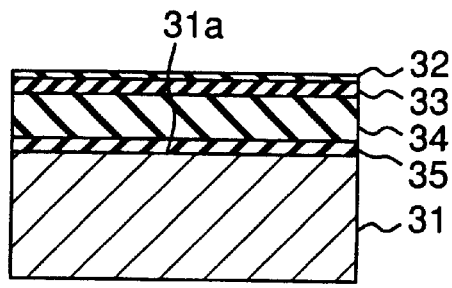

(5) Next, as in the step (3), the ambient in the reaction tube 115 is replaced with an inert gas, such as nitrogen gas ($N_2$) or argon gas (Ar), with minimized oxygen and water contents, and the temperature of the silicon substrate 31 is decreased by air cooling, and thereafter increased again by lamp heating (V4 in FIG. 8). Subsequently, the ambient in the reaction tube 115 is replaced with an oxidizing gas containing nitrogen at a temperature of 900–1100° C. to form a second oxynitride film 35 with film thickness 1–5 nm between the second silicon oxide film 34 and the substrate silicon 31 as shown in FIG. 4D (H4 in FIG. 8). For the ambient, nitrogen monoxide (NO), dinitrogen monoxide ($N_2O$), nitrogen dioxide ($NO_2$) or the like is used. The pressure of the ambient may be either atmospheric pressure or low pressure, but in the present embodiment, the pressure or temperature is set lower than that in the formation of the first oxynitride film 33 so that the nitrogen concentration of the second oxynitride film 35 will be lower than the nitrogen concentration of the first oxynitride film 33. The above film thickness range of the second oxynitride film 35 is appropriate for realizing nitrogen concentrations of 0.5–3 atom %.

In addition to the reduced scatter of film thickness of the first silicon oxide film 32 and hence the reduced scatter of film thickness and nitrogen concentration of the first oxynitride film 33, the second silicon oxide film 34 also has a reduced scatter of film thickness, and the interface 31a between the second silicon oxide film 34 and the substrate silicon 31 has been flattened, as described above. As a result, the second oxynitride film 35 can be fabricated with a narrow scatter of film thickness and of nitrogen concentration.

Figure 4E:
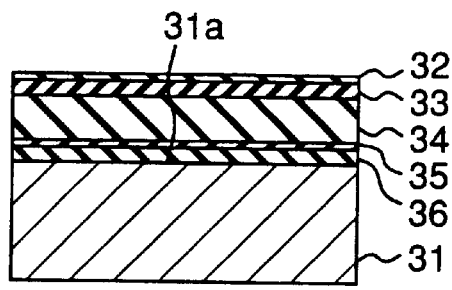

(6) Next, as in the step (4), the ambient in the reaction tube 115 is replaced with an inert gas such as nitrogen gas ($N_2$) or argon gas (Ar) with oxygen and water contents minimized, and the temperature of the silicon substrate 31 is decreased by air cooling, and thereafter increased by lamp heating once again (V5 in FIG. 8). Subsequently, the ambient in the reaction tube 115 is replaced with an oxidizing gas containing no nitrogen at a temperature of 700–850° C. to form a third silicon oxide film 36 with a film thickness of 1–5 nm between the second oxynitride film 35 and the substrate silicon 31 as shown in FIG. 4E (H5 in FIG. 8). For the ambient, ozone ($O_3$) or an oxygen gas containing ozone ($O_3/O_2$) is used, and the pressure of the ambient is set to as low as 1 Pa or less. The above film thickness range of the third silicon oxide film 36 is appropriate for reducing hole traps that have been increased by the oxynitridation process, and the oxidation temperature is within such a range that a good film quality can be obtained in this film thickness range.

As described above, the first and second silicon oxide films 32, 34 have been reduced in variation of film thickness, the first and second oxynitride films 33, 35 have been reduced in variation of film thickness as well as variation of nitrogen concentration, and moreover the interface 31a between the second oxynitride film 35 and the substrate silicon 31 has been made flat. This results in a reduced variation of film thickness and nitrogen concentration of the third silicon oxide film 36, and a flattened interface 31a between the third silicon oxide film 36 and the substrate silicon 31.

Monatomic oxygen dissociated from the ozone in the ambient will be easily diffused in the oxynitride film and will easily react with silicon without being so much affected by the presence of nitrogen atoms in the oxynitride film, as compared with oxygen molecules. Accordingly, the third silicon oxide film 36 is formed into a uniform film thickness without being so much affected by variations in nitrogen concentration of the oxynitride film 33, 35 that have already been formed. Further, since the lamp-heating type oxidizing furnace allows the oxidation to be attained at higher temperatures and in shorter time, as compared with the resistance-heating oxidizing furnace, the diffusion coefficient of oxidizing species can be further enlarged. Accordingly, the influence of scattering, or variation, of nitrogen concentration of the oxynitride films 33, 35 that have already been formed is further reduced, so that the third silicon oxide film 36 is formed into an even more uniform film thickness. The reason why the ambient is set to a low pressure of 1 Pa or less is to lower the rate of oxidation without lowering the diffusion coefficient of oxidizing species and to thereby improve the film thickness controllability. In the present case, the oxidation process is carried out at a relatively low temperature as compared with ordinary drying oxidation. Accordingly, redistribution of the nitrogen concentration profile will hardly occur.

(7) After this, the ambient in the reaction tube 115 is replaced with an inert gas such as nitrogen gas ($N_2$) or argon gas (Ar) with oxygen and water contents minimized, and the temperature of the silicon substrate 31 is decreased by air cooling (V6 in FIG. 8). After a sufficient temperature decrease, the silicon substrate 31 is transferred from the reaction tube 115 to the post-processing cassette chamber 116 through the passage 117C. Then, the valve 118C is closed and the post-processing cassette chamber 116 is put into atmospheric pressure, in which state the silicon substrate 31 is taken out. Thus, the formation of the gate dielectric films is completed.

As described above, the method of the present embodiment reduces the scattering, or variation, of film thickness of the first, second and third silicon oxide films 32, 34, 36, and the scattering, or variation, of film thickness and nitrogen concentration of the first and second oxynitride films 33, 35, and moreover flattens the interface 31a between the third silicon oxide film 36 and the substrate silicon 31. Accordingly, variation in film thickness of the gate dielectric films as a whole is narrower, as compared with the conventional counterpart, so that the dielectric breakdown properties of the gate dielectric films are improved. Also, since the second and third silicon oxide films 34, 36 are allowed to be set to a film thickness of 1 nm or more without impairing the film thickness uniformity or interface flatness of the whole gate dielectric film, it becomes possible to solve various problems caused by oxynitridation, such as changes in strain of the $Si/SiO_2$ interface, increases in hole traps due to chemical species related to nitrogen such as $Si_2=NH$, or decreases in the carrier mobility in regions having low electric fields in directions vertical to the MOS interface.

Furthermore, among the first and second oxynitride films 33, 35, the first oxynitride film 33 that is farther from the silicon surface 31a has a relatively high nitrogen concentration. This allows an effective prevention of increases in device degradations due to the so-called boron penetration or hot-carrier-induced-device-degradations related to the diffusion of hydrogen from inter-layer dielectric films. Also, because of a relatively small nitrogen concentration of the second oxynitride film 35, it is possible to solve the above problems such as changes in the strain of the $Si/SiO_2$ interface, increases in hole traps due to chemical species related to nitrogen such as $Si_2=NH$, or decreases in the carrier mobility in regions having low electric fields in directions vertical to the MOS interface.

Although fabrication of a three-layer and a five-layer gate dielectric films has been explained in connection with the above embodiments, this is not limitative, of course. The present invention may also be applied to cases where gate dielectric films of seven or more layers are formed.

Further, a silicon substrate is employed as the wafer 110 in the above embodiments, it is also possible to use a wafer wherein a silicon layer is formed on one side of a dielectric substrate like SOI (silicon on insulator).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming gate dielectric films, said gate dielectric films at least including two silicon oxide films and an oxynitride film disposed between the two silicon oxide films, comprising:

cleaning a surface of a wafer in an ambient of an inert gas and/or an ambient under a high vacuum of $10^{-4}$ to $10^{-6}$ Pa, into a clean state having no naturally oxidized films, at least said surface of the wafer being formed of silicon;

replacing the ambient surrounding the wafer having a clean surface without any naturally oxidized films with an oxidizing gas containing no nitrogen and then heating the wafer in the replaced ambient to form a first silicon oxide film on the silicon surface;

replacing the ambient with an oxidizing gas containing nitrogen, and heating the wafer in the replaced ambient to form a first oxynitride film between the first silicon oxide film and the silicon; and replacing the ambient with an oxidizing gas containing no nitrogen, and then heating the wafer in the replaced ambient to form a second silicon oxide film between the first oxynitride film and the silicon.

2. The method according to claim 1, further comprising:

after forming said second silicon oxide film, replacing the ambient with an oxidizing gas containing nitrogen, and heating the wafer in this ambient to form a second oxynitride film between the second silicon oxide film and the silicon; and replacing the ambient with an oxidizing gas containing no nitrogen, and heating the wafer in this ambient to form a third silicon oxide film between the second oxynitride film and the silicon.

3. The method according to claim 1, wherein during periods of transition from one step to another for forming each film, the ambient is changed over to an inert gas.

4. The method according to claim 2, wherein during periods of transition from one step to another for forming each film, the ambient is changed over to an inert gas.

5. The method according to claim 1, wherein in forming said first silicon oxide film, a temperature at which the wafer is heated is set to between 300° C. and 700° C.

6. The method according to claim 1, wherein in forming each silicon oxide film, the ambient is placed under a pressure lower than an atmospheric pressure.

7. The method according to claim 2, wherein in forming each silicon oxide film, the ambient is placed under a pressure lower than an atmospheric pressure.

8. The method according to claim 1, wherein in forming said first silicon oxide film, one of steam, ozone, oxygen containing steam and/or ozone is used for the ambient.

9. The method according to claim 1, wherein in forming said first oxynitride film, an ambient composed of one or more gases selected from a group consisting of nitrogen monoxide, dinitrogen monoxide and nitrogen dioxide is used.

10. The method according to claim 2, wherein in forming each oxynitride film, an ambient composed of one or more gases selected from a group consisting of nitrogen monoxide, dinitrogen monoxide and nitrogen dioxide is used.

11. The method according to claim 2, wherein in forming said first oxynitride film, an ambient composed of one or more gases selected from a group consisting of nitrogen monoxide, dinitrogen monoxide, nitrogen dioxide, and ammonia is used.

12. The method according to claim 1, wherein in forming said second silicon oxide film, one of ozone and oxygen containing ozone is used for the ambient.

13. The method according to claim 2, wherein in forming each of said second and third silicon oxide films, one of ozone and oxygen containing ozone is used for the ambient.

14. The method according to claim 1, wherein in forming said second silicon oxide film, the ambient is placed under a pressure lower than an atmospheric pressure, and a temperature at which the wafer is heated is set to between 700° C. and 1200° C.

15. The method according to claim 2, wherein in forming each of said second and third silicon oxide films, the ambient is placed under a pressure lower than an atmospheric pressure, and a temperature at which the wafer is heated is set to between 700° C. and 1200° C.

16. The method according to claim 2, wherein in forming said first oxynitride film and in forming said second oxynitride film, a pressure of the ambient, a temperature at which the wafer is heated, and/or a time for which the wafer is heated, is adjusted such that the first oxynitride film has a nitrogen concentration higher than that of the second oxynitride film.

17. A method of forming gate dielectric films, said dielectric films at least including two silicon dioxide films and an oxynitride film disposed between the two silicon dioxide films, comprising:

replacing an ambient surrounding a wafer having a clean surface without any naturally oxidized films with an oxidizing gas containing no nitrogen, at least said surface of the wafer being formed of silicon, and then heating the wafer in the replaced ambient to form a first silicon oxide film on the silicon surface;

replacing the ambient with an oxidizing gas composed of ammonia, and heating the wafer in the replaced ambient to form a silicon nitride film between the first silicon oxide film and the silicon;

replacing the ambient with an oxidizing gas containing no nitrogen, and heating the wafer in the replaced ambient to form a second silicon oxide film between the silicon nitride film and the silicon;

replacing the ambient with an oxidizing gas containing nitrogen, and heating the wafer in the replaced ambient to form a oxynitride film between the second silicon oxide film and the silicon; and replacing the ambient with an oxidizing gas containing no nitrogen, and then heating the wafer in the replaced ambient to form a third silicon oxide film between the oxynitride film and the silicon.

18. The method according to claim 17, wherein during periods of transition from one step to another for forming each film, the ambient is changed over to an inert gas.

19. The method according to claim 17, wherein in forming said first silicon oxide film, a heating temperature at which the wafer is heated is set to between 300° C. and 700° C.

20. The method according to claim 17, wherein in forming each silicon oxide film, the ambient is placed under a pressure lower than an atmospheric pressure.

21. The method according to claim 17, wherein in forming said first silicon oxide film, one of steam, ozone, oxygen containing steam and/or ozone is used for the ambient, and wherein in forming each of said second and third silicon oxide films, one of ozone and oxygen containing ozone is used for the ambient.

22. The method according to claim 17, wherein in forming each of said second and third silicon oxide films, the ambient is placed under a pressure lower than an atmospheric pressure, and a temperature at which the wafer is heated is set to between 700° C. and 1200° C.

23. The method according to claim 17, wherein in forming said oxynitride film, an ambient composed of one or more gases selected from a group consisting of nitrogen monoxide, dinitrogen monoxide and nitrogen dioxide is used.

24. The method according to claim 1, wherein said step of replacing the ambient surrounding the wafer having a clean surface without any naturally oxidized films is preceded by the step of transporting the wafer without exposing the wafer to air to inside of a reaction tube for forming the gate dielectric films, wherein the clean surface state with no naturally oxidized films is maintained during the transportation of the wafer.

25. The method according to claim 17, wherein said step of replacing an ambient surrounding a wafer having a clean surface without any naturally oxidized films is preceded by the steps of:

cleaning the surface of the wafer in an ambient of an inert gas and/or an ambient under a high vacuum of $10^{-4}$ to $10^{-6}$ Pa, into a clean state having no naturally oxidized films; and transporting the wafer without exposing the wafer to air to inside of a reaction tube for forming the gate dielectric films, wherein the clean surface state with no naturally oxidized films is maintained during the transportation of the wafer.

26. An apparatus for forming gate dielectric films, said gate dielectric films at least including two silicon oxide films and an oxynitride film disposed between the two silicon oxide films, comprising:

a cleaning chamber for cleaning a surface of a wafer into a clean state having no naturally oxidized films, at least said surface of the wafer being formed of silicon;

a reaction chamber for forming said gate dielectric films on the surface of the wafer;

a mechanism for controlling an ambient and a pressure of said cleaning chamber and those of said reaction chamber independently of each other; and a mechanism for transporting the wafer from said cleaning chamber to said reaction chamber without exposing the wafer to air.

27. The apparatus according to claim 26, wherein said cleaning chamber is coupled with said reaction chamber through a passage, and said mechanism for controlling comprises a valve for shutting off said passage.

* * * * *